(12) United States Patent
Markhart

(10) Patent No.: US 7,041,432 B2
(45) Date of Patent: *May 9, 2006

(54) APPARATUS AND METHOD FOR THERMALLY DEVELOPING FLEXOGRAPHIC PRINTING ELEMENTS

(76) Inventor: Gary T. Markhart, 2904 Corte Celeste, Carlsbad, CA (US) 92009

( * ) Notice: Subject to any disclaimer, the term of this patent is extended or adjusted under 35 U.S.C. 154(b) by 0 days.

This patent is subject to a terminal disclaimer.

(21) Appl. No.: 10/891,351

(22) Filed: Jul. 14, 2004

(65) Prior Publication Data

US 2005/0211120 A1    Sep. 29, 2005

Related U.S. Application Data

(63) Continuation-in-part of application No. 10/811,763, filed on Mar. 29, 2004.

(51) Int. Cl.
    G03F 7/34    (2006.01)
(52) U.S. Cl. .................. 430/306; 430/309; 430/330; 430/350
(58) Field of Classification Search ............. 430/309
    See application file for complete search history.

(56) References Cited

U.S. PATENT DOCUMENTS

| 3,264,103 A | 8/1966 | Cohen et al. |
| 4,777,509 A | 10/1988 | Komatsubara et al. |
| 5,107,764 A * | 4/1992 | Gasparrini .............. 101/425 |
| 5,175,072 A | 12/1992 | Martens |
| 5,279,697 A | 1/1994 | Peterson et al. |
| 5,666,617 A | 9/1997 | Goodman et al. |
| 5,717,985 A | 2/1998 | Labombard et al. |
| 5,798,019 A | 8/1998 | Cushner et al. |
| 5,916,403 A | 6/1999 | Cushner et al. |
| 5,925,500 A | 7/1999 | Yang et al. |
| 5,987,284 A | 11/1999 | Lewis |
| 6,006,059 A | 12/1999 | Till et al. |
| 6,180,325 B1 | 1/2001 | Gelbart |

(Continued)

FOREIGN PATENT DOCUMENTS

EP    1 239 329 A2    9/2002

(Continued)

*Primary Examiner*—Andrew H. Hirshfeld
*Assistant Examiner*—Joshua Zimmerman
(74) *Attorney, Agent, or Firm*—Carmody & Torrance LLP (57) ABSTRACT

An improved apparatus for thermally developing a flexographic printing element to reveal a relief image on the surface and a method of using the apparatus to expose and develop a flexographic printing element. The apparatus typically comprises means for softening or melting non-crosslinked photopolymer on the imaged and exposed surface of the flexographic printing element; at least one roll that is contactable with the imaged surface of the flexographic printing element and capable of moving over at least a portion of the imaged surface of the flexographic printing element to remove the softened or melted non-crosslinked photopolymer on the imaged and exposed surface of the flexographic printing element; and means for maintaining contact between the at least one roll and the imaged and exposed surface of the flexographic printing element. The means for softening or melting non-crosslinked photopolymer on the imaged and exposed surface of the flexographic printing element comprise a heater positioned adjacent to the imaged surface of the flexographic printing element and/or heating the at least one roll that contactable with the imaged surface of the flexographic printing element. The apparatus may also contain an exposure device to crosslink and cure the imaged surface of the flexographic printing element prior to thermal development.

48 Claims, 3 Drawing Sheets

U.S. PATENT DOCUMENTS

| | | |
|---|---|---|
| 6,309,799 B1 | 10/2001 | Ruckl |
| 6,490,424 B1 * | 12/2002 | Okamoto .................... 399/101 |
| 6,496,676 B1 | 12/2002 | Caruthers, Jr. et al. |
| 6,531,184 B1 | 3/2003 | Bode et al. |
| 6,797,454 B1 * | 9/2004 | Johnson et al. ............. 430/306 |
| 6,861,203 B1 * | 3/2005 | Gelbart ...................... 430/306 |
| 2003/0180655 A1 | 9/2003 | Fan et al. |
| 2003/0211423 A1 | 11/2003 | Mengel et al. |

FOREIGN PATENT DOCUMENTS

| | | |
|---|---|---|
| WO | WO 01/18604 A2 | 3/2001 |
| WO | WO 01/88615 A1 | 11/2001 |

* cited by examiner

APPARATUS AND METHOD FOR THERMALLY DEVELOPING FLEXOGRAPHIC PRINTING ELEMENTS

CROSS REFERENCE TO RELATED APPLICATIONS

This application is a continuation-in-part of co-pending patent application Ser. No. 10/811,763, filed Mar. 29, 2004, the subject matter of which is herein incorporated by reference in its entirety.

FIELD OF THE INVENTION

The present invention is directed to a method and an apparatus for thermally developing flexographic printing elements, including printing plates and printing sleeves.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Such plates offer a number of advantages to the printer, based chiefly on their durability and the ease with which they can be made.

Although photopolymer printing elements are typically used in "flat" sheet form, there are particular applications and advantages to using the printing element in a continuous cylindrical form, as a continuous in-the-round (CITR) photopolymer sleeve. CITR photopolymer sleeves add the benefits of digital imaging, accurate registration, fast mounting, and no plate lift to the flexographic printing process. CITR sleeves have applications in the flexographic printing of continuous designs such as in wallpaper, decoration and gift-wrapping paper, and other continuous designs such as tablecloths, etc. CITR sleeves enable flexographic printing to be more competitive with gravure and offset on print quality.

A typical flexographic printing plate as delivered by its manufacturer, is a multilayered article made of, in order, a backing or support layer, one or more unexposed photocurable layers, a protective layer or slip film, and a cover sheet. A typical CITR photopolymer sleeve generally comprises a sleeve carrier (support layer) and at least one unexposed photocurable layer on top of the support layer.

It is highly desirable in the flexographic prepress printing industry to eliminate the need for chemical processing of printing elements in developing relief images, in order to go from plate to press more quickly. Processes have been developed whereby photopolymer printing plates are prepared using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. U.S. 2003/0180655, and U.S. 2003/0211423, and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of the process allow for use of the process in the manufacture of flexographic plates for printing newspapers and other publications where quick turnaround times and high productivity are important.

The photopolymer layer allows for the creation of the desired image and provides a printing surface. The photopolymers used generally contain binders, monomers, photoinitiators, and other performance additives. Photopolymer compositions useful in the practice of this invention include those described in U.S. patent application Ser. No. 10/353,446 filed Jan. 29, 2003, the teachings of which are incorporated herein by reference in their entirety. Various photopolymers such as those based on polystyrene-isoprene-styrene, polystyrene-butadiene-styrene, polyurethanes and/or thiolenes as binders are useful. Preferable binders are polystyrene-isoprene-styrene, and polystyrene-butadiene-styrene, especially block co-polymers of the foregoing.

The composition of the photopolymer should be such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) will melt or substantially soften while the cured photopolymer will remain solid and intact at the temperature chosen. Thus the difference in melt temperature allows the uncured photopolymer to be selectively removed thereby creating an image.

The printing element is then selectively exposed to actinic radiation, which is traditionally accomplished in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer, which is also sensitive to laser ablation. A laser is then used to ablate selected areas of the actinic radiation opaque layer creating an in situ negative, and the printing element is then flood exposed through the in situ negative. In the third alternative, a focused beam of actinic radiation is used to selectively expose the photopolymer. Any of these alternative methods produces an acceptable result, with the criteria being the ability to selectively expose the photopolymer to actinic radiation thereby selectively curing portions of the photopolymer.

Once the photopolymer layer of the printing element has been selectively exposed to actinic radiation, it can then be developed using heat. As such, the printing element is generally heated to at least about 70° C. The exact temperature will depend upon the properties of the particular photopolymer being used. However, two primary factors should be considered in determining the development temperature:

1. The development temperature is preferably set between the melt temperature of the uncured photopolymer on the low end and the melt temperature of the cured photopolymer on the upper end. This will allow selective removal of the photopolymer, thereby creating the image.
2. The higher the development temperature, the quicker the process time will be. However, the development temperature should not be so high as to exceed the melt temperature of the cured photopolymer or so high that it will degrade the cured photopolymer. The temperature should be sufficient to melt or substantially soften the uncured photopolymer thereby allowing it to be removed.

Once the heated printing element has been developed, uncured photopolymer can be melted or removed. In most instances, the heated printing element is contacted with a material that will absorb or otherwise remove the softened or melted uncured photopolymer. This removal process is generally referred to as "blotting". Blotting is typically accomplished using a screen mesh or an absorbent fabric. Either woven or non-woven fabric is used and the fabric can be polymer based or paper, so long as the fabric can withstand the operating temperatures involved. In most instances, blotting is accomplished using rollers to bring the material and the heated printing plate element into contact.

U.S. Pat. No. 5,175,072 to Martens, the subject matter of which is herein incorporated by reference in its entirety, describes the removal of uncured portions of the photopolymer by using an absorbent sheet material. The uncured photopolymer layer is heated by conduction, convection, or other heating method to a temperature sufficient to effect melting. By maintaining more or less intimate contact of the absorbent sheet material with the photocurable layer, a transfer of the uncured photopolymer from the photopolymer layer to the absorbent sheet material takes place. While still in the heated condition, the absorbent sheet material is separated from the cured photopolymer layer in contact with the support layer to reveal the relief structure. After cooling, the resulting flexographic printing plate can be mounted on a printing plate cylinder.

Upon completion of the blotting process, the printing plate element is preferably post-exposed to further actinic radiation in the same machine, cooled and then ready for use.

Depending upon the particular application, the printing element may also comprise other optional components. For instance, it is frequently preferable to use a removable coversheet over the photopolymer layer to protect the layer during handling. If used, the coversheet is removed either just before or just after the selective exposure to actinic radiation. Other layers such as slip layer or masking layers as described in U.S. Pat. No. 5,925,500 to Yang et al., the teachings of which are incorporated herein by reference in their entirety, can also be used.

The drawback to many of the current methods of thermal development is that these methods can be used only on flat plates, which must then be mounted after development. This operation requires an additional machine and more time and can also result in a loss in accuracy when registration between multiple plates and colors is required.

Current thermal development apparatuses using heated rolls for blotting away the uncured photopolymer typically use only one heated roll that is of approximately the same width as the plate. This increases the difficulty in making printing elements of different sizes. In addition, additional problems may arise when attempting to make the blotting machine larger to accommodate larger printing elements.

Another problem with the current blotting methods is that a tremendous amount of force (approximately 100 pounds/linear inch) must be applied by the heated roll to force the blotting material into the image on the printing element. This large force can cause the heated roll to bend, resulting in an uneven floor. Furthermore, the heating and blotting process must often be repeated several times in order to obtain effective removal of the uncured photopolymer.

While various thermal development apparatuses have been developed for use in the production of relief image printing plates, there remains a need in the art for a thermal developing device that can be used with cylindrical printing elements, either as continuous printing sleeves or as plates that are then formed into printing sleeves. Furthermore, there remains a need in the art for a thermal developing device that can easily be used to produce different sized printing elements.

Furthermore, exposing, developing and post exposure/detack steps have traditionally been carried out in separate devices. This requires additional time to transfer the printing element from the exposure device to the development device and can affect the quality of the finished plate as a result of handling the printing element. Thus, it would be desirable to accomplish the exposing, developing and post exposure/detack steps in the same apparatus in order to improve both the quality and the accuracy of the final product.

U.S. Pat. No. 6,180,325 to Gelbart, the subject matter of which is herein incorporated by reference in its entirety suggests a method of applying a patterned coating to a printing element to form a mask and subsequently exposing the printing element to actinic radiation without dismounting it from the apparatus where the coating is applied. However, there is no suggestion in Gelbart that exposing and thermal development steps can be accomplished in the same apparatus.

As such, there remains a need in the art for an improved apparatus that can accomplish the steps of exposing the resin, and developing, and post exposing/detacking the printing element in the same system in order reduce the handling by making one machine do the work of three machines and to provide for even exposure, development, and post exposure/detack across the width of printing elements of various sizes.

SUMMARY OF THE INVENTION

The present invention comprises an improved thermal development apparatus and a method of using the improved thermal development apparatus to remove uncured photopolymer from the imaged surface of a flexographic printing element. In another embodiment, the present invention comprises an improved apparatus that can accomplish both the exposing and the development steps and a method of using the combined exposing and developing apparatus to both expose the flexographic printing element to actinic radiation and to remove uncured photopolymer from the imaged surface of the flexographic printing element.

In a preferred embodiment, the apparatus comprises:
(i) means to support, and preferably cycle or rotate, a flexographic printing element;
(ii) optionally, but preferably, means for exposing an imaged surface of the flexographic printing element, said means comprising one or more sources of actinic radiation; and
(iii) means for thermally developing said imaged and exposed surface of the flexographic printing select, said means comprising:
   a) means for softening or melting non-crosslinked photopolymer on the imaged and exposed surface of the flexographic printing element;
   b) at least one roll that is contactable with the imaged surface of the flexographic printing element and capable of moving over at least a portion of the imaged surface of the flexographic printing element to remove the softened or melted non-crosslinked photopolymer on the imaged and exposed surface of the flexographic printing element; and
   c) means for maintaining contact between the at least one roll and the imaged and exposed surface of the flexographic printing element.

If desired, two rolls may be used, such that the two rolls are self-centering against the imaged surface of the cylindrical printing element.

The roll(s) preferably have a blotting material positioned around at least the portion of the roll(s) in contact with the imaged surface of the flexographic printing element. In an alternate embodiment, a doctor blade can be positioned adjacent to the roll(s) to remove non-crosslinked photopolymer from the roll(s) after it has been removed from the imaged surface of the flexographic printing element.

In another aspect of the invention, one or more additional rolls may be positioned in an opposing position on the opposite side of the cylindrical printing element to increase resin removal from the imaged surface of the flexographic printing element and to increase imaging speed.

In one embodiment, the means for softening or melting non-crosslinked photopolymer on the imaged and exposed surface of the flexographic printing element comprises heating the at least one roll that contactable with the imaged surface of the flexographic printing element. In another embodiment of the invention, the means for softening or melting non-crosslinked photopolymer on the imaged and exposed surface of the flexographic printing element comprises positioning a heater adjacent to the imaged and exposed surface of the flexographic printing element. The heated roll and external heater can also be used together.

The invention also comprises a method of using the thermal development apparatus of the invention comprising the steps of:
a) supporting and rotating a flexographic printing element;
b) optionally, but preferably, exposing an imaged surface of the flexographic printing element to one or more sources of actinic radiation;
c) melting or softening non-crosslinked polymer on the imaged surface of the flexographic printing element;
d) causing contact between the imaged surface of the flexographic printing element and at least one roll; and
e) rotating the at least one roll against at least a portion of the imaged surface of the flexographic printing element to remove non-crosslinked photopolymer from the imaged and exposed surface of the flexographic printing element.

DETAILED DESCRIPTION OF THE PREFERRED EMBODIMENTS OF THE INVENTION

The present invention relates to an improved thermal development apparatus and a method of using the apparatus to remove non-crosslinked polymer from an imaged surface of a relief image printing element during a process for manufacturing the relief image printing element.

In another embodiment, the present invention relates to an improved combined exposing and developing apparatus and a method of using the apparatus to expose the relief image printing plate to actinic radiation to selectively cure, i.e. crosslink, portions of the photopolymer layer revealed during the imaging step, and thermally developing the relief image printing plate to remove non-crosslinked polymer from the imaged and exposed surface of the relief printing element during a process for manufacturing the relief image printing element.

The present invention also relates to an improved combined exposing, developing, and post exposure/detack apparatus and a method of using the combined apparatus during a process for manufacturing relief image printing plates.

A flexographic printing element is produced from a photocurable printing blank by imaging the photocurable printing blank to produce a relief image on the surface of the printing element. This is generally accomplished by selectively exposing the photocurable material to actinic radiation, which exposure acts to harden or crosslink the photocurable material in the irradiated areas.

The photocurable printing blank contains one or more layers of an uncured photocurable material on a suitable backing layer. The photocurable printing blank can be in the form of a continuous (seamless) sleeve or as a flat, planar plate that is mounted on a carrier sleeve. The plate can be held onto the carrier sleeve using any suitable means, including vacuum, adhesive, and/or mechanical clamps.

Printing elements of various sizes can be processed in the novel apparatus of the invention, limited only by the length of the cylinder on which the printing element is mounted and the length of the one or more carriages traversing the means for exposing the printing element and/or the means for thermally developing the printing element across the length of the printing cylinder. These features will be described in greater detail below.

The printing element is selectively exposed to actinic radiation in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer that is sensitive to laser ablation. A laser is then used to ablate selected areas of the actinic radiation opaque layer creating an in situ negative. In the third alternative, a focused beam of actinic radiation is used to selectively expose the photopolymer. Any of these alternative methods is acceptable, with the criteria being the ability to selectively expose the photopolymer to actinic radiation thereby selectively curing portions of the photopolymer.

In a preferred embodiment, the printing element comprises a photopolymer layer that is coated with an actinic radiation (substantially) opaque layer, which typically comprises carbon black, and which is sensitive to laser ablation. A laser, which is preferably an infrared laser, is then used to ablate selected areas of the actinic radiation opaque layer creating an in situ negative. This technique is well-known in the art, and is described for example in U.S. Pat. Nos. 5,262,275 and 6,238,837 to Fan, and in U.S. Pat. No. 5,925,500 to Yang et al., the subject matter of each of which is herein incorporated by reference in its entirety.

The selected areas of the photopolymer layer revealed during laser ablation are then exposed to actinic radiation to crosslink and cure the portions of the photopolymer layer that are not covered by the in situ negative. The type of radiation used is dependent on the type of photoinitiator in the photopolymerizable layer. The radiation-opaque material in the infrared sensitive layer which remains on top of the photopolymerizable layer prevents the material beneath from being exposed to the radiation and thus those areas covered by the radiation-opaque material do not polymerize. The areas not covered by the radiation-opaque material are exposed to actinic radiation and polymerize and thus crosslink and cure. Any conventional sources of actinic radiation can be used for this exposure step. Examples of suitable visible or UV sources include carbon arcs, mercury-vapor arcs, fluorescent lamps, electron flash units, electron beam units and photographic flood lamps.

Next, the photopolymer layer of the printing element is developed to remove uncured (i.e., non-crosslinked) portions of the photopolymer, without disturbing the cured portions of the photopolymer layer, to produce the relief image.

In a preferred embodiment, the novel thermal developing apparatus of the invention is combined with the exposure device so that the printing element may be exposed and developed in the same apparatus without the need to remove the printing element from the exposing apparatus to place it into the developing apparatus. In another embodiment, the apparatus further comprises a means for post exposure/detack in the same apparatus.

The apparatus of the invention typically comprises:
(i) means to support, and preferably cycle or rotate, a flexographic printing element;
(ii) optionally, but preferably, means for exposing an imaged surface of the flexographic printing element to actinic radiation; and
(iii) means for thermally developing said imaged and exposed surfaces of the flexographic printing element, wherein the thermally developing means typically comprises:
  a) means for softening or melting non-crosslinked photopolymer on the imaged and exposed surface of the flexographic printing element;
  b) at least one roll that is contactable with the imaged surface of the flexographic printing element and capable of moving over at least a portion of the imaged surface of the flexographic printing element to remove the softened or melted non-crosslinked photopolymer on the imaged and exposed surface of the flexographic printing element; and
  c) means for maintaining contact between the at least one roll and the imaged and exposed surface of the flexographic printing element.

Figure 1:
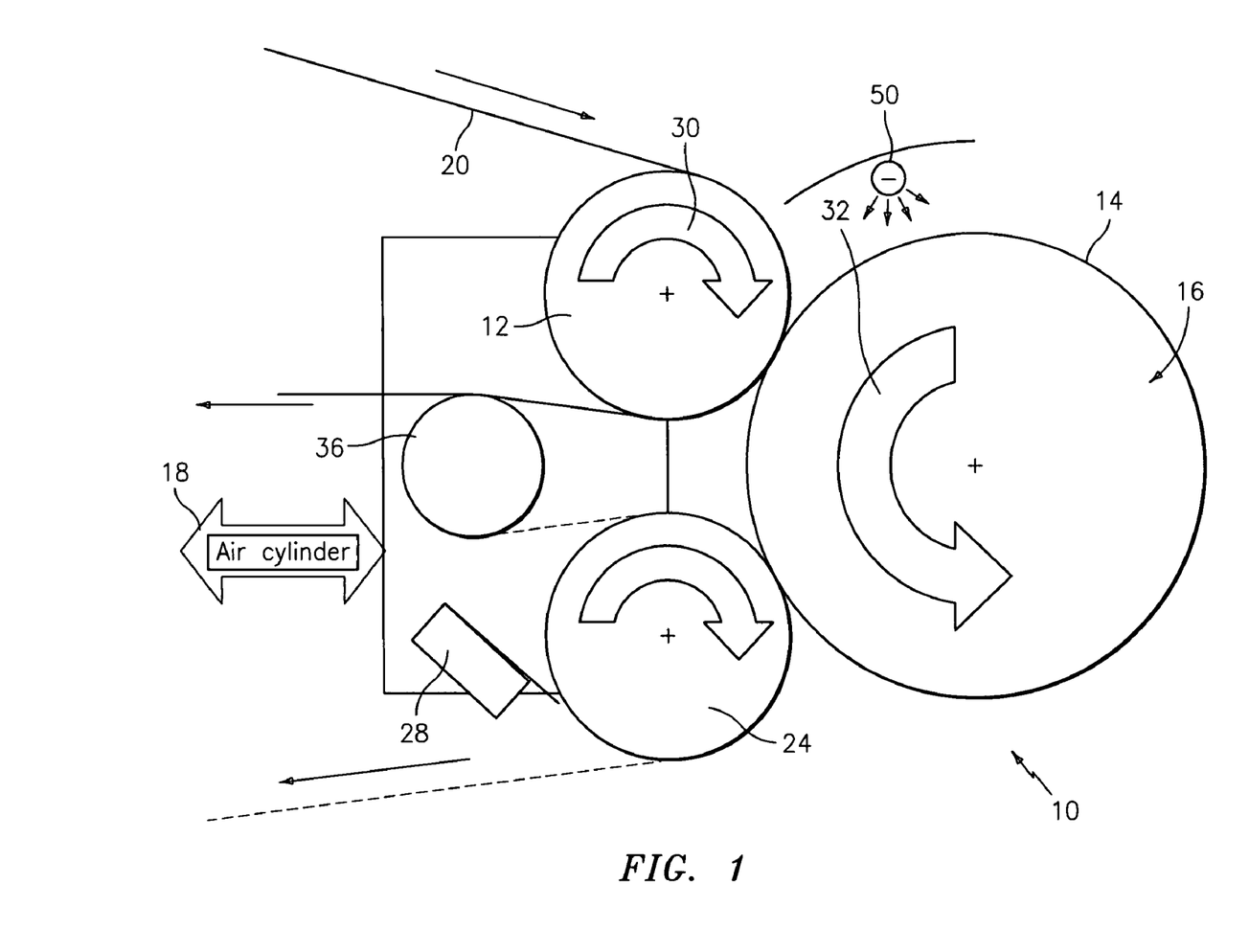
FIG. 1 depicts one embodiment of the thermal development apparatus of the instant invention.
Figure 2:
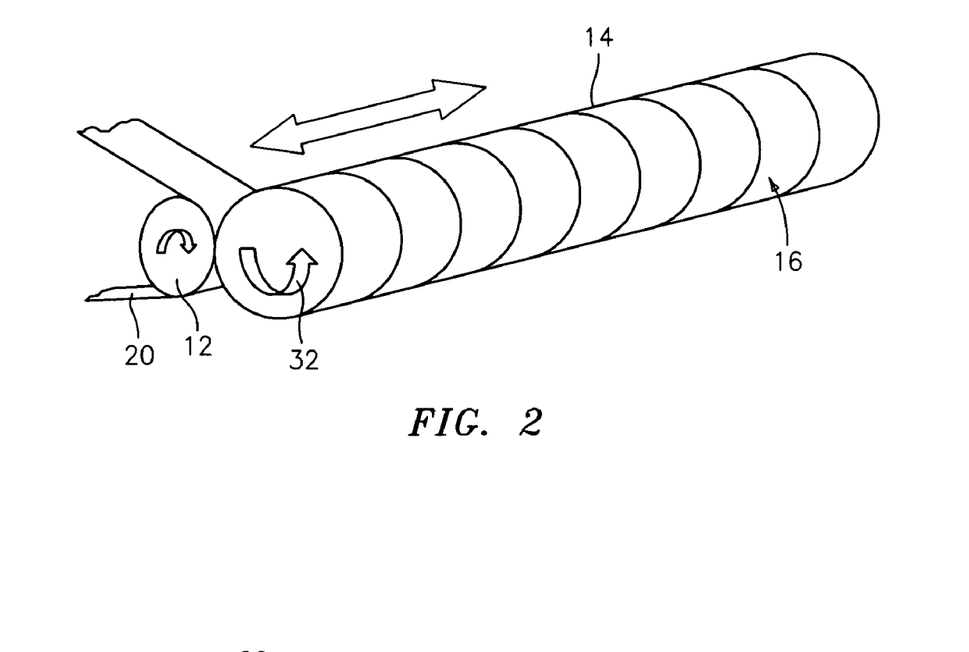
FIG. 2 depicts a different view of the thermal development apparatus of the invention and shows the motion of the heated roll traversing the length of the cylindrical printing element.

As depicted in FIG. 1, the thermal developing apparatus (10) comprises at least one roll (12) that is contactable with an imaged surface (14) of a flexographic printing element (16) and a means (18) for maintaining contact between the at least one roll (12) and the imaged surface (14) of the flexographic printing element (16). In one embodiment, the at least one roll (12) is heated and is moved over at least a portion of the imaged surface (14) of the flexographic printing element (16), and non-crosslinked polymer on the imaged surface (14) of the flexographic printing element (16) is melted and removed by the at least one heatable roll (12). In another embodiment a heating source (50) is positioned prior to the roll (12) to soften or melt non-crosslinked polymer on the imaged and exposed surface of the flexographic printing element for subsequent removal by the roll (12). The heating source (50) may also be used in conjunction with the heated roll (12) to at least partially soften or melt non-crosslinked polymer on the imaged surface of the flexographic printing element.

The at least one roll (12) generally has a length of about 4 to about 12 inches, and a diameter of about 4 to about 6 inches, although the invention is not limited to rolls of a particular size or diameter. A skilled artisan would be able to determine a suitable length and diameter for a roll that would be usable in the thermal developing apparatus of the invention.

The thermal developing apparatus may comprise two rolls (12) and (24) that are opposably positionable adjacent and apart from each other and are each maintainable in contact with the imaged surface (14) of the flexographic printing element (16). When the two rolls (12) and (24) are contacted with the imaged surface (14) of the flexographic printing element (16), the two rolls (12) and (24) are self-centering against the imaged surface (14) of the flexographic printing element (16).

The heating source (50) is typically an infrared heater or hot air heater, although other heating sources could also be used in the practice of the invention and would be known to those skilled in the art. In a preferred embodiment, the heating source is an infrared heater. In the alternative, or in addition, the at least one roll can be a heated roller with a heating source contained within the roll.

The means (18) for maintaining contact between the at least one roll (12) and the imaged surface (14) of the flexographic printing element (16) typically comprises an air cylinder or a hydraulic cylinder that acts to force the at least one roll (12) against the imaged surface (14) of the flexographic printing element (16). Other means for maintaining the contact between the at least one roll (12) and the flexographic printing element (16) would also be known to one skilled in the art.

Although the flexographic printing element (16) is depicted as being a cylindrical flexographic printing element, i.e., a printing sleeve, as discussed above, the invention is not limited to cylindrical flexographic printing elements and would also be usable for removing non-crosslinked polymer from the imaged surface of a flat flexographic printing element. The flat flexographic printing element may be used as a printing plate or may be wrapped around a cylindrical shaft and used as a cylindrical printing element.

In a preferred embodiment, the thermal developing apparatus comprises a blotting material (20) positioned on at least a portion of the at least one roll (12). Thus, when the at least one roll (12) is heated and is contacted with the imaged surface (14) of the flexographic printing element (16), non-crosslinked polymer on the imaged surface (14) of the flexographic printing element (16) is melted by the heated roll (12) and is removed by the blotting material (20). Alternately, the heating source (50) melts or softens the non-crosslinked polymer and the blotting material (20) positioned on at least a portion of the at least one roll removes the melted or softened polymer.

The blotting material (20) is typically looped under and around at least the portion of the at least one roll (12) that contacts the imaged surface (14) of the flexographic printing element (16). The blotting material (20) is continuously supplied to the at least one roll (12) from a remote source (not shown) of the blotting material (20). The thermal developing apparatus further comprises a rewind device (not shown) to carry away the blotting material (20) that contains the removed non-crosslinked polymer.

The blotting material preferably comprises paper or woven or non-woven fabrics. Blotting materials that are usable include screen mesh and absorbent fabrics, including polymer-based and non-polymer-based fabrics.

In an alternate embodiment, the thermal developing apparatus comprises a doctor blade (28) that is positionable adjacent to the at least one roll (12) or (24), which is shown positioned adjacent to the second roll (24). The doctor blade is used in place of the blotting roll. When the at least one roll (24) removes non-crosslinked polymer from the imaged surface (14) of the flexographic printing element (16), the doctor blade (28) wipes the non-crosslinked polymer from the surface of the at least one roll (24).

The thermal developing apparatus removes non-crosslinked polymer from the imaged surface (14) of the flexographic printing element by rotating the at least one roll (12) over at least a portion of the imaged surface (14) of the flexographic printing element (16). Preferably, the at least one roll (12) rotates in a first direction (30) and the cylindrical flexographic printing element (16) rotates in an opposite direction (32) from the at least one roll (12).

The thermal developing apparatus also comprises means (26) (shown in FIG. 4) for allowing the at least one roll to traverse along the length of the cylindrical flexographic printing element, and such means typically comprise one or more carriages. The advantage to this design feature is that movement of the roll across the surface of the printing element allows the improved thermal developing apparatus of the invention to accommodate printing elements of various lengths and diameters. In this case, the at least one roll rotates along the length or around the circumference of the printing element and also moves in a direction parallel to the axis of rotation along the width of the printing element.

The blotting material (20) may be continuously fed to the two rolls (12) and (24) by looping the blotting material (20) under and around at least the portion of the first roll (12) that is contactable with the imaged surface (14) of the flexographic printing element (16), looping the blotting material (20) around one or more track rolls (36) positioned between the two rolls (12) and (24), and then looping the blotting material (20) under and around at least the portion of the second roll (24) that is contactable with the imaged surface (14) of the flexographic printing element (16).

Figure 3:
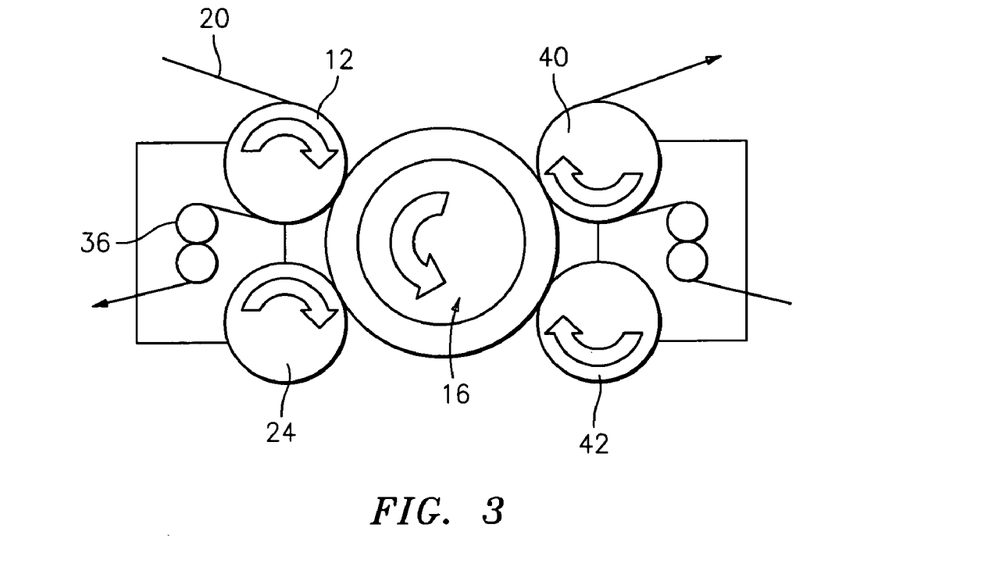
FIG. 3 depicts another embodiment of the thermal development apparatus of the instant invention wherein opposing heads are used to improve imaging speed and eliminate roll bending and machine stiffness design problems.

As shown in FIG. 3, the thermal developing apparatus may further comprise one or more additional rolls (40) and (42) that are positionable in an opposing position on an opposite side of the cylindrical flexographic printing element (16). The one or more additional rolls (40) and (42) are maintainable in contact with at least a portion of the imaged surface (14) of the flexographic printing element (16). When the one or more additional rolls (40) and (42) are contacted with the imaged surface (14) of the flexographic printing element (16), removal of resin from the imaged surface (14) of the flexographic printing element (16) as well as the imaging speed can be increased. Use of the two additional rolls (40) and (42) may also eliminate roll bending and machine stiffness design problems, which can cause uneven floors in large flat plate machines. Also, since the high forces required to push the blotter into the resin oppose each other, the improved design features of the invention allow for the use of much lighter materials (i.e., fiberglass instead of steel support shafts) to support the printing sleeve while it is being processed.

Figure 4:
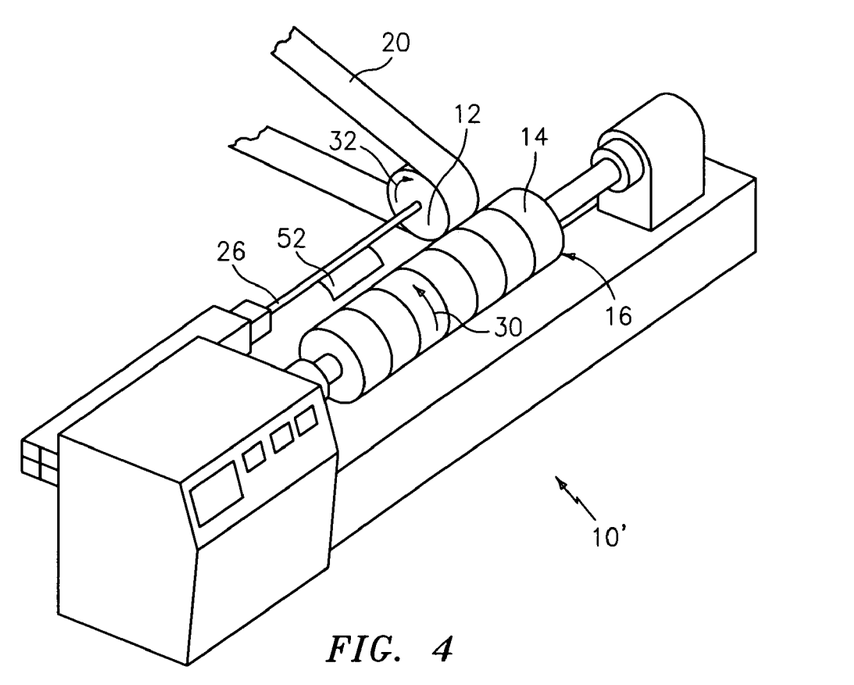
FIG. 4 depicts an embodiment of the invention wherein the exposing and developing steps are accomplished at the same time on the same apparatus.

As shown in FIG. 4, the apparatus may include means for both exposing and thermally developing the flexographic printing element.

The exposing and thermal development apparatus (10') depicted in FIG. 4 typically comprises one or more sources of actinic radiation (52) mounted on a carriage (26) that can traverse the length of the flexographic printing element (16). The one or more sources of actinic radiation (52) typically comprise one or more UV light sources that are capable of selectively exposing and curing the imaged surface (14) of the flexographic printing element (16).

During operation, the carriage (26) traverses the one or more sources of actinic radiation (52) over the length of the imaged surface (14) of the flexographic printing element (16) to cure the flexographic printing element (16). While the carriage (26) traverses the length of the imaged surface (14) of the flexographic printing element (16), the flexographic printing element (16) is continuously rotated in a first direction (30) so that the entire imaged surface of the flexographic printing element (16) is exposed to cure the imaged surface (14) of the flexographic printing element (16).

The at least one roll (12) may be mounted on the same carriage (26) as the one or more sources of actinic radiation (52), or may be mounted on a separate carriage (not shown) from the one or more sources of actinic radiation (52). As shown in FIG. 1, the apparatus also contains means (18) for maintaining contact between the at least one roll (12) and the imaged surface (14) of the flexographic printing element (16).

The at least one roll (12) is moved over at least a portion of the imaged surface (14) of the flexographic printing element (16) that has previously been traversed by the one or more sources of actinic radiation (52) to remove non-crosslinked polymer on the imaged surface (14) of the flexographic printing element (16).

In a preferred embodiment, the flexographic printing element (16) is rotated in the first direction (30), while the roll (12) is rotated in a second direction (32). The flexographic printing element (16) is continuously rotated in the first direction (30) during both the exposing and developing steps so that the entire imaged surface (14) of the flexographic printing element (16) can be exposed and developed. The spiral nature of this process, wherein the printing sleeve rotates as the carriage (26) traverses the length of the flexographic printing element (16) ensures even exposure and development across any size printing element (16).

Figure 5:
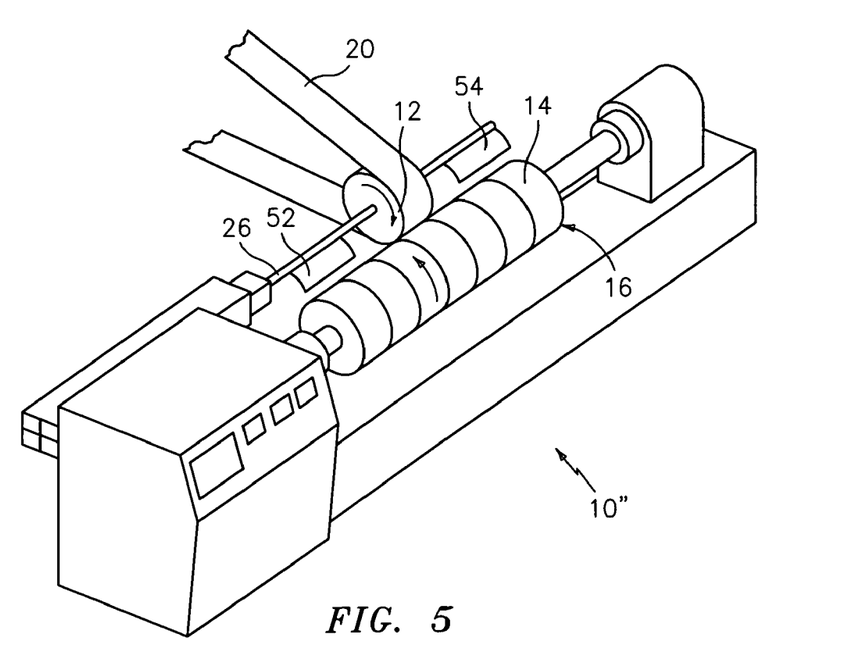
FIG. 5 depicts another embodiment of the invention wherein the combined exposing and developing apparatus further comprises a device to de-tack and post cure the printing element.

In another embodiment, as depicted in FIG. 5, the thermal development apparatus (10") of the invention further comprises a device (54) for detacking and post-curing the flexographic printing element (16) once the flexographic printing element (16) has been exposed with the one or more UV lights (52) and thermally developed with the at least one roll (12). The use of the detacking and post-curing device (54) in the apparatus (10") of the invention eliminates the need for handling the printing element, i.e., moving the printing element to a subsequent apparatus, and again provides for a more precise and accurate printing element.

The present invention is also directed to a method of removing non-crosslinked polymer from an imaged surface of the flexographic printing element with at least one roll. In a preferred embodiment, immediately prior to removal of the non-crosslinked polymer in a thermal developing step, the flexographic printing element is selectively exposed to actinic radiation to selectively crosslink and cure imaged portions of the flexographic printing element.

The method generally comprises the steps of:
 a) supporting, and preferably rotating the flexographic printing element;
 b) optionally, but preferably, exposing an imaged surface of the flexographic printing element to actinic radiation to crosslink and cure the imaged surface of the flexographic printing element;

c) melting or softening non-crosslinked polymer on the imaged and exposed surface of the flexographic printing element;

d) causing contact between the imaged surface of the flexographic printing element and at least one roll; and e) rotating the at least one roll against at least a portion of the imaged surface of the flexographic printing element to remove the softened or melted non-crosslinked photopolymer from the imaged surface of the flexographic printing element.

The at least one roll can traverse the length of the cylindrical flexographic printing element in a spiral or stepwise manner. In a preferred embodiment, the at least one roll traverses the length of the flexographic printing element one or multiple times until all of the non-crosslinked polymer is removed from the imaged surface of the flexographic printing element. The roll can also be angled such that its axis of rotation is not parallel with the axis of rotation of the flexographic printing element, and can be transverse to the axis of rotation of the flexographic printing element.

In one embodiment, the non-crosslinked photopolymer on the imaged and exposed surface of the flexographic printing element is melted or softened by heating the at least one roll that contacts the imaged and exposed surface of the flexographic printing element.

In another embodiment, the non-crosslinked photopolymer on the imaged and exposed surface of the flexographic printing element is melted or softened by positioning a heater adjacent to the imaged and exposed surface of the flexographic printing element to soften or melt the non-crosslinked photopolymer for subsequent removal by the at least one roll. The heated roll and infrared heater may also be used together to facilitate additional removal of non-crosslinked photopolymer. If used, the at least one heated roll is typically maintained at a temperature that is between the melt temperature of the uncured photopolymer on the low end and the melt temperature of the cured photopolymer on the upper end. This will allow selective removal of the photopolymer thereby creating the image. Preferably the at least one heated roll is maintained at a temperature of about 350° F. to about 450° F.

As discussed above, in the preferred embodiment, the one or more sources of actinic radiation are one or more UV lights. If desired, the light source may include a filter to prevent undue heating of the printing element.

In another preferred embodiment, the method comprises a further step of detacking and post-curing the exposed and thermally developed printing element.

What is claimed is:

1. An apparatus for exposing and developing a cylindrical flexographic printing element, the apparatus comprising:
   means to support, and preferably rotate, the cylindrical printing element;
   means for exposing an imaged surface of the cylindrical printing element to actinic radiation to selectively crosslink and cure the imaged surface of the cylindrical printing element; and
   means for thermally developing the imaged and exposed surface of the cylindrical printing element, wherein said means for thermally developing the imaged and exposed surface comprises:
   a) means for softening or melting non-crosslinked photopolymer on the imaged and exposed surface of the cylindrical printing element;
   b) at least one roll that is contactable with the imaged surface of the flexographic printing element and capable of rotating against the curved surface of the cylindrical printing element and simultaneously moving across at least a portion of the length of the cylindrical printing element to remove the softened or melted non-crosslinked photopolymer on the imaged and exposed surface of the cylindrical printing element; and
   c) means for maintaining contact between the at least one roll and the imaged and exposed surface of the cylindrical printing element.

2. The apparatus according to claim 1, further comprising means for detacking and post-curing the flexographic printing element, wherein said means for detacking and post-curing the flexographic printing element are capable of moving over at least a portion of the flexographic printing element.

3. The apparatus according to claim 1, wherein the means for exposing the imaged surface of the flexographic printing element to actinic radiation comprise one or more ultraviolet lights.

4. The apparatus according to claim 1, wherein the means for exposing the imaged surface of the flexographic printing element and the at least one roll that is contactable with the imaged and exposed surface of the flexographic printing element are mounted on a carriage, and said carriage traverses the length of the flexographic printing element as the flexographic printing element continuously rotates in a direction opposite to the at least one roll.

5. The apparatus according to claim 1, wherein a blotting material is positioned on at least a portion of the at least one roll, and wherein when the at least one roll is contacted with the imaged surface of the flexographic printing element, non-crosslinked polymer on the imaged surface of the flexographic printing element is removed by the blotting material.

6. The apparatus according to claim 5, wherein the blotting material is looped under and around at least the portion of the at least one roll that contacts the imaged surface of the flexographic printing element.

7. The apparatus according to claim 6, wherein the blotting material is continuously supplied to the at least one roll from a remote source of the blotting material.

8. The apparatus according to claim 6, further comprising a rewind device to carry away the blotting material that contains the removed non-crosslinked polymer.

9. The apparatus according to claim 5, wherein the blotting material is paper.

10. The apparatus according to claim 1, comprising a doctor blade positioned adjacent to the at least one roll, wherein when the at least one roll removes non-crosslinked polymer from the imaged and exposed surface of the flexographic printing element, the doctor blade wipes the non-crosslinked polymer from the surface of the at least one roll.

11. The apparatus according to claim 1, wherein the means for maintaining contact between the at least one roll and the imaged surface of the flexographic printing element comprises an air cylinder or a hydraulic cylinder that forces the at least one roll against the imaged surface of the flexographic printing element.

12. The apparatus according to claim 1, wherein the at least one roll rotates in a first direction and the flexographic printing element rotates in an opposite direction from the at least one roll.

13. The apparatus according to claim 1, wherein the at least one roll comprises two rolls that are opposably positioned adjacent and apart from each other and are each maintainable in contact with the imaged surface of the flexographic printing element, and wherein when the two rolls are contacted with the imaged surface of the flexographic printing element, the two rolls are self-centering against the imaged surface of the flexographic printing element.

14. The apparatus according to claim 13, wherein a blotting material is continuously fed to the two rolls by looping the blotting material under and around at least the portion of the first roll that is contactable with the imaged surface of the flexographic printing element, looping the blotting material around one or more track rolls positioned between the two rolls, and then looping the blotting material under and around at least the portion of the second roll that is contactable with the imaged surface of the flexographic printing element.

15. The apparatus according to claim 14, further comprising one or more additional rolls that are positionable in an opposing position on an opposite side of the flexographic printing element, wherein the one or more additional rolls are maintainable in contact with at least a portion of the imaged surface of the flexographic printing element.

16. The apparatus according to claim 1, wherein the means for softening or melting non-crosslinked photopolymer on the imaged and exposed surface of the flexographic printing element comprises heating the at least one roll that contactable with the imaged surface of the flexographic printing element.

17. The apparatus according to claim 1, wherein the means for softening or melting non-crosslinked photopolymer on the imaged and exposed surface of the flexographic printing element comprises positioning a heater adjacent to the imaged and exposed surface of the flexographic printing element.

18. The apparatus according to claim 17, wherein the heater is an infrared heater or a hot air heater.

19. The apparatus according to claim 16, further comprising a heater positioned adjacent to the imaged and exposed surface of the flexographic printing element to provide additional softening or melting of the non-crosslinked photopolymer on the imaged and exposed surface of the flexographic printing element.

20. The apparatus according to claim 1, wherein the cylindrical printing element is selected from the group consisting of continuous printing sleeves and planar printing plates mounted on carrier sleeves.

21. A method of exposing and developing a cylindrical flexographic printing element, the method comprising the steps of:
 a) supporting and rotating the cylindrical printing element on a support;
 b) exposing an imaged surface of the cylindrical printing element to one or more sources of actinic radiation to crosslink and cure selected portions of the imaged surface of the cylindrical printing element;
 c) melting or softening non-crosslinked polymer on the imaged and exposed surface of the cylindrical printing element;
 d) causing contact between the imaged surface of the cylindrical printing element and at least one roll; and
 e) rotating the at least one roll against the curved surface of the cylindrical printing element as the cylindrical printing element rotates in a first direction and simultaneously moving the at least one roll across at least a portion of the length of the cylindrical printing element to remove non-crosslinked photopolymer from the imaged and exposed surface of the flexographic printing element.

22. The method according to claim 21, comprising a step of detacking and post-curing the flexographic printing element.

23. The method according to claim 21, wherein the one or more sources of actinic radiation comprise one or more ultraviolet lights.

24. The method according to claim 21, wherein the one or more sources of actinic radiation traverse the length of the flexographic printing element.

25. The method according to claim 21, wherein the at least one roll moves back and forth across the length of the flexographic printing element multiple times.

26. The method according to claim 25, wherein the at least one roll moves across the length of the flexographic printing element in a spiral or stepwise manner.

27. The method according to claim 21, wherein the at least one roll rotates in a direction opposite from the cylindrical flexographic printing element.

28. The method according to claim 21, wherein an air cylinder or a hydraulic cylinder is used to maintain contact between the at least one roll and the imaged surface of the flexographic printing element.

29. The method according to claim 21, wherein at least the portion of the at least one roll that is in contact with the imaged surface of the flexographic printing element is covered with a blotting material and the blotting material removes the non-crosslinked polymer from the imaged surface of the flexographic printing element.

30. The method according to claim 29, wherein the blotting material is looped under and around at the least the portion of the at least one roll that is in contact with the imaged surface of the flexographic printing element.

31. The method according to claim 30, wherein the blotting material is continuously fed to the at least one roll from a remote source of the blotting material.

32. The method according to claim 31, wherein the blotting material that contains the removed non-crosslinked photopolymer is rewound onto a rewind device.

33. The method according to claim 29, wherein the blotting material comprises paper.

34. The method according to claim 21, wherein the non-crosslinked polymer remaining on the at least one roll after removal from the imaged surface of the flexographic printing element is removed from the at least one roll by positioning a doctor blade adjacent to the at least one roll to wipe the non-crosslinked polymer from the surface of the at least one roll.

35. The method according to claim 29, wherein the at least one roll comprises two rolls that are positioned adjacent and apart from each other and are each maintained in contact with the imaged surface of the flexographic printing element and wherein the two rolls are self-centering against the imaged surface of the flexographic printing element.

36. The method according to claim 35, wherein the blotting material is continuously fed to the two rolls by wrapping blotting material around at least the portion of the first roll that is in contact with the imaged surface of the flexographic printing element, looping the blotting material around one or more track rolls positioned between the two rolls, and then wrapping the blotting material around at least the portion of the second roll that is in contact with the imaged surface of the flexographic printing element.

37. The method according to claim 35, wherein one or more additional rolls are positioned in an opposing position on an opposite side of the flexographic printing element and maintained in contact with at least a portion of the imaged surface of the flexographic printing element.

38. The method according to claim 30, wherein the non-crosslinked photopolymer on the imaged and exposed surface of the flexographic printing element is melted or softened by heating the at least one roll that contacts the imaged and exposed surface of the flexographic printing element.

39. The method according to claim 30, wherein the non-crosslinked photopolymer on the imaged and exposed surface of the flexographic printing element is melted or softened by positioning a heater adjacent to the imaged and exposed surface of the flexographic printing element.

40. The method according to claim 38, further comprising a heater positioned adjacent to the imaged and exposed surface of the flexographic printing element to provide additional melting or softening of the non-crosslinked photopolymer.

41. The method according to claim 38, wherein the at least one heated roll is maintained at a temperature of about 350° F. to about 450° F.

42. The method according to claim 21, wherein the cylindrical printing element is selected from the group consisting of continuous printing sleeves and planar printing plates mounted on carrier sleeves.

43. An apparatus for exposing and developing a flexographic printing element, the apparatus comprising:
   means to support, and preferably rotate, the flexographic printing element;
   means for exposing an imaged surface of the flexographic printing element to actinic radiation to selectively crosslink and cure the imaged surface of the flexographic printing element; and
   means for thermally developing the imaged and exposed surface of the flexographic printing element, said means for thermally developing the imaged and exposed surface of the flexographic printing element comprising:
      a) means for softening or melting non-crosslinked photopolymer on the imaged and exposed surface of the flexographic printing element;
      b) at least one element that is contactable with the imaged surface of the flexographic printing element and capable of traversing the length of the imaged surface of the flexographic printing element to remove the softened or melted non-crosslinked photopolymer on the imaged and exposed surface of the flexographic printing element; and
      c) means for maintaining contact between the at least one contactable element and the imaged and exposed surface of the flexographic printing element;
   wherein said means for exposing the imaged surface of the flexographic printing element to actinic radiation and said means of thermally developing the imaged and exposed surface of the flexographic printing element are mounted on a reciprocating carriage that traverses the length of the flexographic printing element to expose and develop the flexographic printing element.

44. The apparatus according to claim 43, wherein the flexographic printing element is a cylindrical flexographic printing element.

45. The apparatus according to claim 43, further comprising means for detacking and/or post-curing the flexographic printing element, wherein the means for detacking and/or post-curing the flexographic printing element are mounted on the same reciprocating carriage as the means for exposing and means for thermally developing the flexographic printing element.

46. An apparatus for exposing and developing a flexographic printing element, the apparatus comprising:
   means to support, and preferably rotate, the flexographic printing element;
   means for exposing an imaged surface of the flexographic printing element to actinic radiation to selectively crosslink and cure the imaged surface of the flexographic printing element; and
   means for thermally developing the imaged and exposed surface of the flexographic printing element, wherein said means for thermally developing the imaged and exposed surface comprises:
      a) means for softening or melting non-crosslinked photopolymer on the imaged and exposed surface of the flexographic printing element;
      b) at least two rolls that are contactable with the imaged surface of the flexographic printing element and capable of moving over at least a portion of the imaged surface of the flexographic printing element to remove the softened or melted non-crosslinked photopolymer on the imaged and exposed surface of the flexographic printing element; and
      c) means for maintaining contact between the at least two rolls and the imaged and exposed surface of the flexographic printing element;
   wherein the at least two rolls are opposably positioned adjacent and apart from each other and are each maintainable in contact with the imaged surface of the flexographic printing element, and wherein when the at least two rolls are contacted with the imaged surface of the flexographic printing clement, the at least two rolls are self-centering against the imaged and exposed surface of the flexographic printing element.

47. A method of exposing and developing a flexographic printing element, the method comprising the steps of:
   a) supporting and rotating the flexographic printing element on a support;
   b) exposing an imaged surface of the flexographic printing element to one or more sources of actinic radiation to crosslink and cure selected portions of the imaged surface of the flexographic printing element,
   c) melting or softening non-crosslinked polymer on the imaged and exposed surface of the flexographic printing element;
   d) causing contact between the imaged surface of the flexographic printing element and at least one roll; and
   e) rotating the at least one roll against at least a portion of the imaged surface of the flexographic printing element to remove non-crosslinked photopolymer from the imaged and exposed surface of the flexographic printing element;
   wherein the steps of exposing the imaged surface of the flexographic printing element to actinic radiation and rotating the at least one roll against at least a portion of the imaged surface of the flexographic printing element are accomplished without removing the flexographic printing element from the support.

48. A method of exposing and developing a flexographic printing element, the method comprising the steps of:
   a) supporting and rotating the flexographic printing element;
   b) exposing an imaged surface of the flexographic printing element to one or more sources of actinic radiation to crosslink and cure selected portions of the imaged surface of the flexographic printing element;
c) melting or softening non-crosslinked polymer on the imaged and exposed surface of the flexographic printing element;
d) causing contact between the imaged surface of the flexographic printing element and at least two rolls; and
e) rotating the at least two rolls against at least a portion of the imaged surface of the flexographic printing element to remove non-crosslinked photopolymer from the imaged and exposed surface of the flexographic printing element;

wherein the at least two rolls are opposably positioned adjacent and apart from each other and are each maintained in contact with the imaged and exposed surface of the flexographic printing element; and wherein when the at least two rolls are contacted with the imaged and exposed surface of the flexographic printing element, the at least two rolls are self-centering against the imaged surface of the flexographic printing element.

* * * * *

UNITED STATES PATENT AND TRADEMARK OFFICE
CERTIFICATE OF CORRECTION

| | | |
|---|---|---|
| PATENT NO. | : 7,041,432 B2 | Page 1 of 1 |
| APPLICATION NO. | : 10/891351 | |
| DATED | : May 9, 2006 | |
| INVENTOR(S) | : Gary T. Markhart | |

It is certified that error appears in the above-identified patent and that said Letters Patent is hereby corrected as shown below:

Column 13

Lines 24-25, between "one roll that" and "contactable" add --is--

Signed and Sealed this

Twenty-fifth Day of July, 2006

JON W. DUDAS
*Director of the United States Patent and Trademark Office*